(12) United States Patent
Nagai et al.

(10) Patent No.: US 9,911,502 B2
(45) Date of Patent: *Mar. 6, 2018

(54) DATA STORAGE DEVICE WITH NONVOLATILE MEMORY

(71) Applicant: Toshiba Memory Corporation, Minato-ku (JP)

(72) Inventors: Koichi Nagai, Tokyo (JP); Katsuya Murakami, Tokyo (JP); Shinji Honjo, Tokyo (JP); Satoru Fukuchi, Chigasaki (JP); Akira Tanimoto, Yokohama (JP); Isao Ozawa, Chigasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/622,191

(22) Filed: Jun. 14, 2017

(65) Prior Publication Data

US 2017/0278576 A1 Sep. 28, 2017

Related U.S. Application Data

(63) Continuation of application No. 14/642,083, filed on Mar. 9, 2015, now Pat. No. 9,704,593.

(60) Provisional application No. 62/072,837, filed on Oct. 30, 2014.

(51) Int. Cl.
*G11C 16/04* (2006.01)
*G11C 16/30* (2006.01)
*G11C 5/14* (2006.01)
*G06F 13/16* (2006.01)

(52) U.S. Cl.
CPC .......... *G11C 16/30* (2013.01); *G06F 13/1668* (2013.01); *G11C 5/144* (2013.01); *Y02B 60/1228* (2013.01)

(58) Field of Classification Search
CPC ..... G11C 16/30; G11C 5/144; G06F 13/1668; Y02B 60/1228
USPC ...................................... 365/185.18
See application file for complete search history.

(56) References Cited

U.S. PATENT DOCUMENTS

| | | | |
|---|---|---|---|
| 5,508,971 A * | 4/1996 | Cernea .................. | G11C 16/30 365/185.14 |
| 7,869,218 B2 | 1/2011 | Ni et al. | |
| 2007/0108293 A1* | 5/2007 | Odate .................. | G06F 1/3203 235/492 |
| 2007/0147157 A1* | 6/2007 | Luo ......................... | G11C 5/143 365/226 |
| 2009/0096506 A1* | 4/2009 | Ogiwara ............... | G11C 5/147 327/530 |

(Continued)

FOREIGN PATENT DOCUMENTS

| | | |
|---|---|---|
| JP | 2009-163851 | 7/2009 |
| JP | 2014-52801 | 3/2014 |

*Primary Examiner* — Tha-O H Bui
(74) *Attorney, Agent, or Firm* — Oblon, McClelland, Maier & Neustadt, L.L.P.

(57) ABSTRACT

According to one embodiment, a data storage device includes a controller driven by a first power supply voltage, a nonvolatile memory controlled by the controller and driven by a second power supply voltage, and a switch element determining whether the second power supply voltage is applied to the nonvolatile memory. The controller is configured to turn off the switch element in a first mode and turn on the switch element in a second mode.

14 Claims, 7 Drawing Sheets

(56) References Cited

U.S. PATENT DOCUMENTS

2012/0089766 A1  4/2012  Yu
2014/0068305 A1  3/2014  Watanabe et al.

* cited by examiner

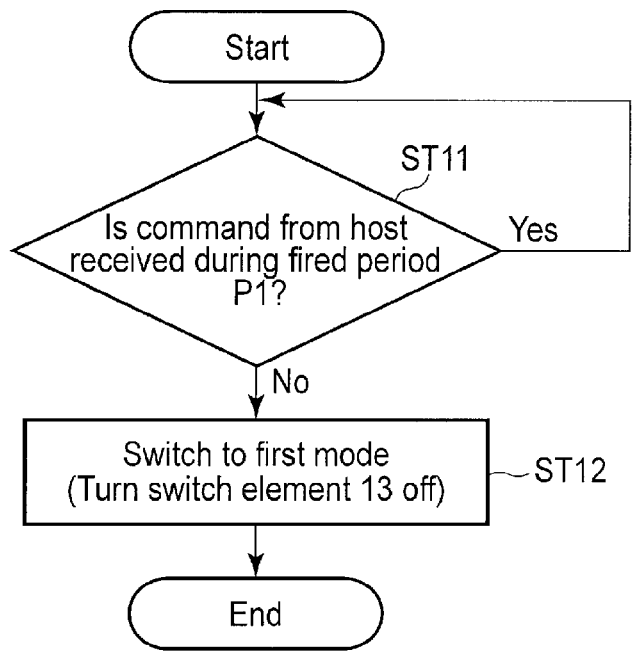
F I G. 6
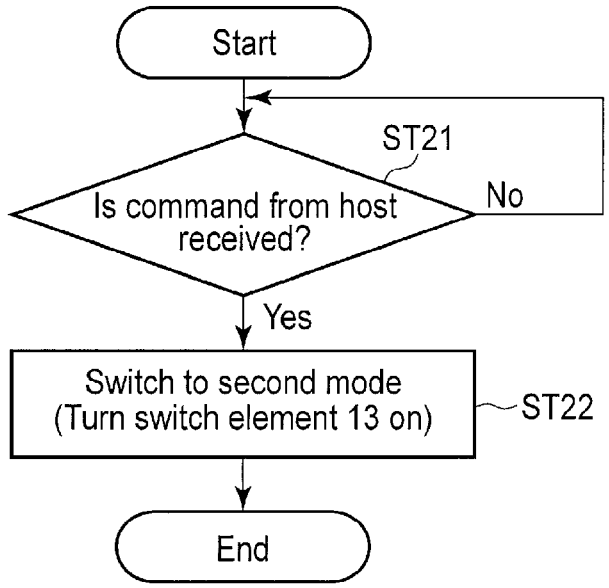
F I G. 7

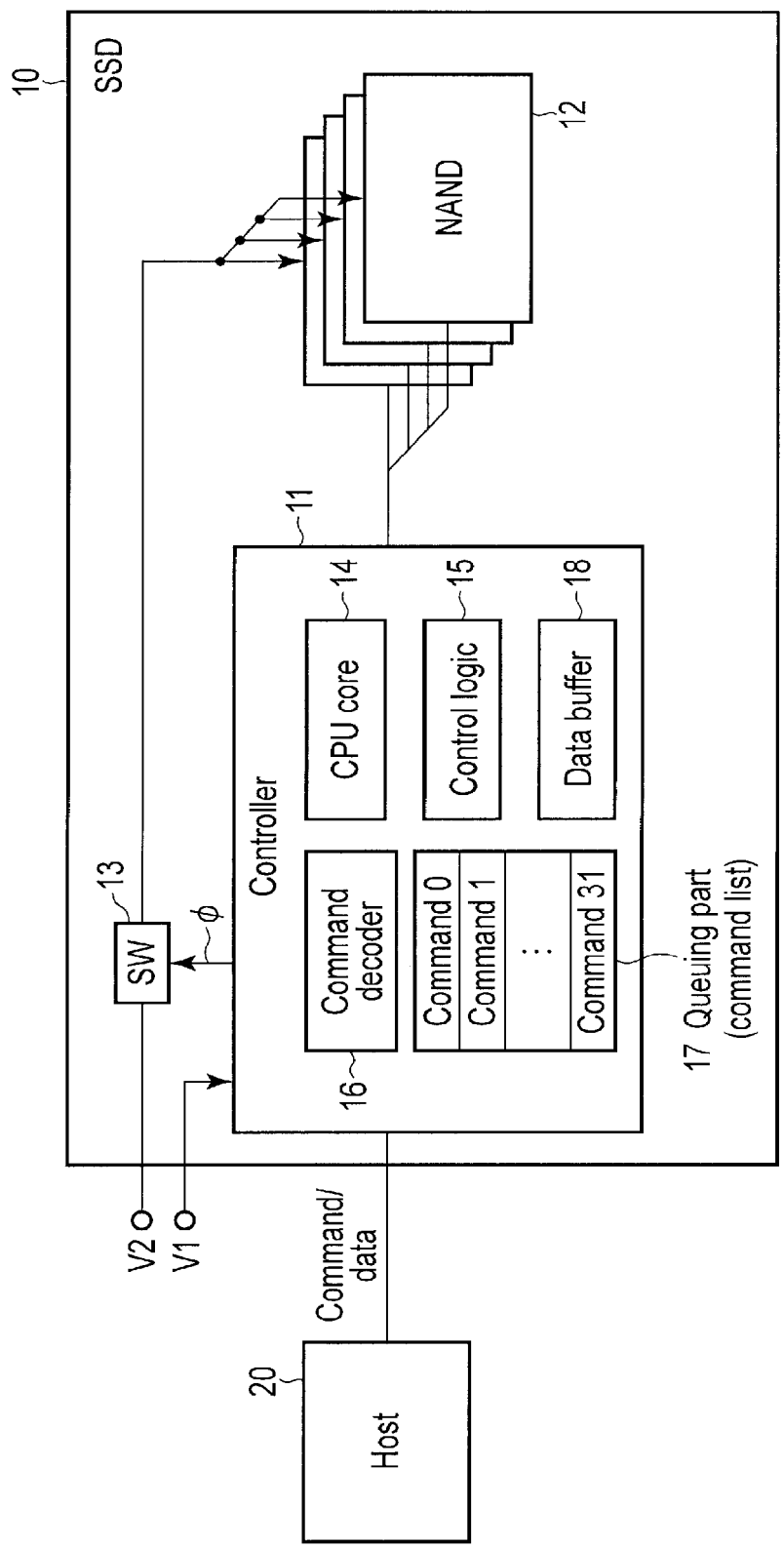
F I G. 8

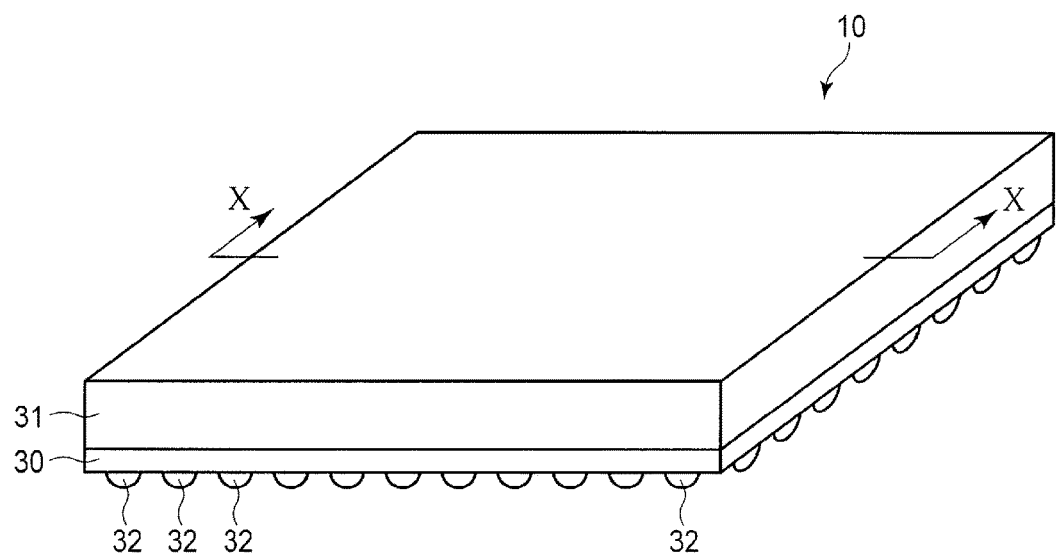
F I G. 9
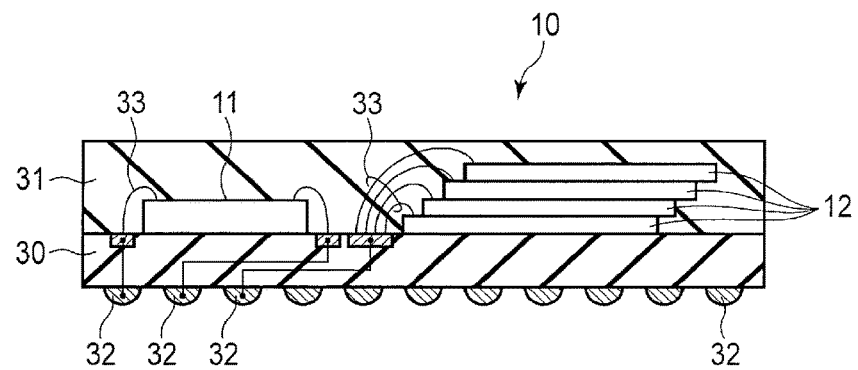
F I G. 10

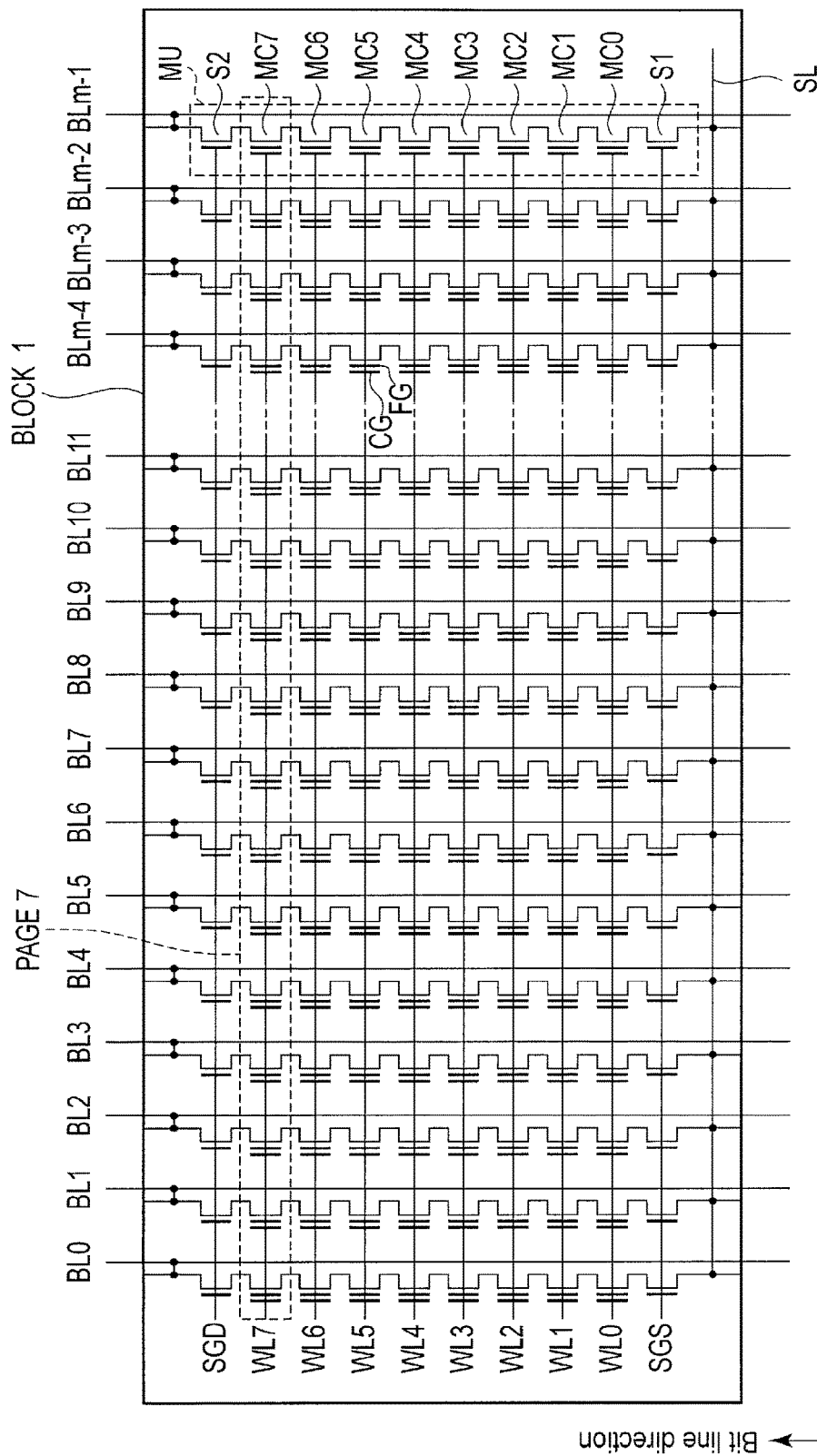
F I G. 11

DATA STORAGE DEVICE WITH NONVOLATILE MEMORY

CROSS-REFERENCE TO RELATED APPLICATIONS

This application is a continuation of and claims the benefit of priority under 35 U.S.C. § 120 from U.S. Ser. No. 14/642,083 filed Mar. 9, 2015, and claims the benefit of priority of U.S. Provisional Application No. 62/072,837 filed Oct. 30, 2014, the entire contents of each of which are incorporated herein by reference.

FIELD

Embodiments described herein relate generally to a data storage device.

BACKGROUND

Recently, storage devices are required to achieve increased capacity and reduced size in order to be compatible with high-performance, compact portable equipment. In the case of a solid-state drive (SSD) serving as a storage device, a ball-grid-array-package solid-state drive (BGA-SSD), in which a nonvolatile memory and a memory controller are integrated in a single package, has been developed. Since reduced power consumption is a key factor in portable equipment, the power consumption of a storage device provided in portable equipment should be reduced as much as possible.

BRIEF DESCRIPTION OF THE DRAWINGS

FIG. 6 is a flowchart showing operations of a controller when switching to the first mode.

FIG. 7 is a flowchart showing operations of the controller when switching to the second mode.

FIG. 8 is a diagram showing a memory system of a fourth embodiment.

FIG. 9 is an illustration showing a BGA-SSD of a fifth embodiment.

FIG. 10 is a cross-sectional view along line X-X in FIG. 9.

FIG. 11 is a diagram showing an example of a memory cell array of a NAND flash memory.

DETAILED DESCRIPTION

In general, according to one embodiment, a data storage device comprises: a controller driven by a first power supply voltage; a nonvolatile memory controlled by the controller and driven by a second power supply voltage; and a switch element determining whether the second power supply voltage is applied to the nonvolatile memory. The controller is configured to turn off the switch element in a first mode and turn on the switch element in a second mode.

First Embodiment

Figure 1:
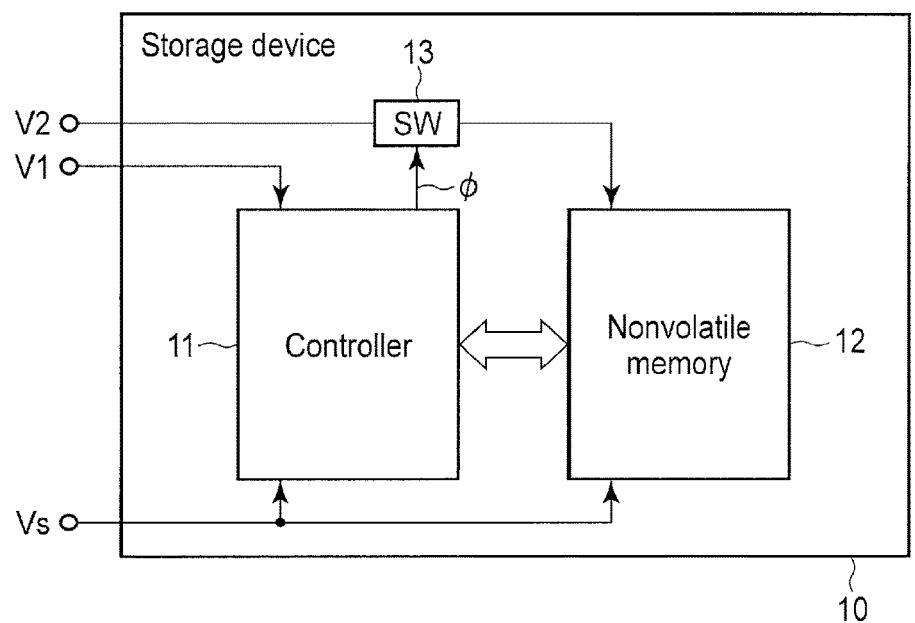
FIG. 1 is a diagram showing a storage device of a first embodiment.

FIG. 1 shows a storage device of a first embodiment.

A storage device 10 comprises a controller 11 and a nonvolatile memory 12. The controller 11 is driven by a first power supply voltage V1. The nonvolatile memory 12 is controlled by the controller 11 and driven by a second power supply voltage V2. The nonvolatile memory 12 is, for example, a NAND flash memory. A reference voltage Vs is, for example, ground voltage, and is applied to the controller 11 and the nonvolatile memory 12.

The storage device 10 further comprises a switch element 13 which determines whether the second power supply voltage V2 is supplied to the nonvolatile memory 12. The switch element 13 is controlled to be turned on and off by a control signal $\phi$ from the controller 11. For example, the controller 11 turns off the switch element 13 in a first mode and turns on the switch element 13 in a second mode.

The first and second power supply voltages V1 and V2 may have the same or different values.

According to such a storage device, when data is not being transferred between the controller 11 and the nonvolatile memory 12, the controller 11 can reduce the power consumption of the nonvolatile memory 12 by switching the second mode to the first mode. Reduction of the power consumption means that no current flows in the nonvolatile memory 12 in the first mode, i.e., the power consumption is zero. This is greatly different from a standby state (with power consumption) executed while the second power supply voltage V2 is applied to the nonvolatile memory 12.

Figure 5:
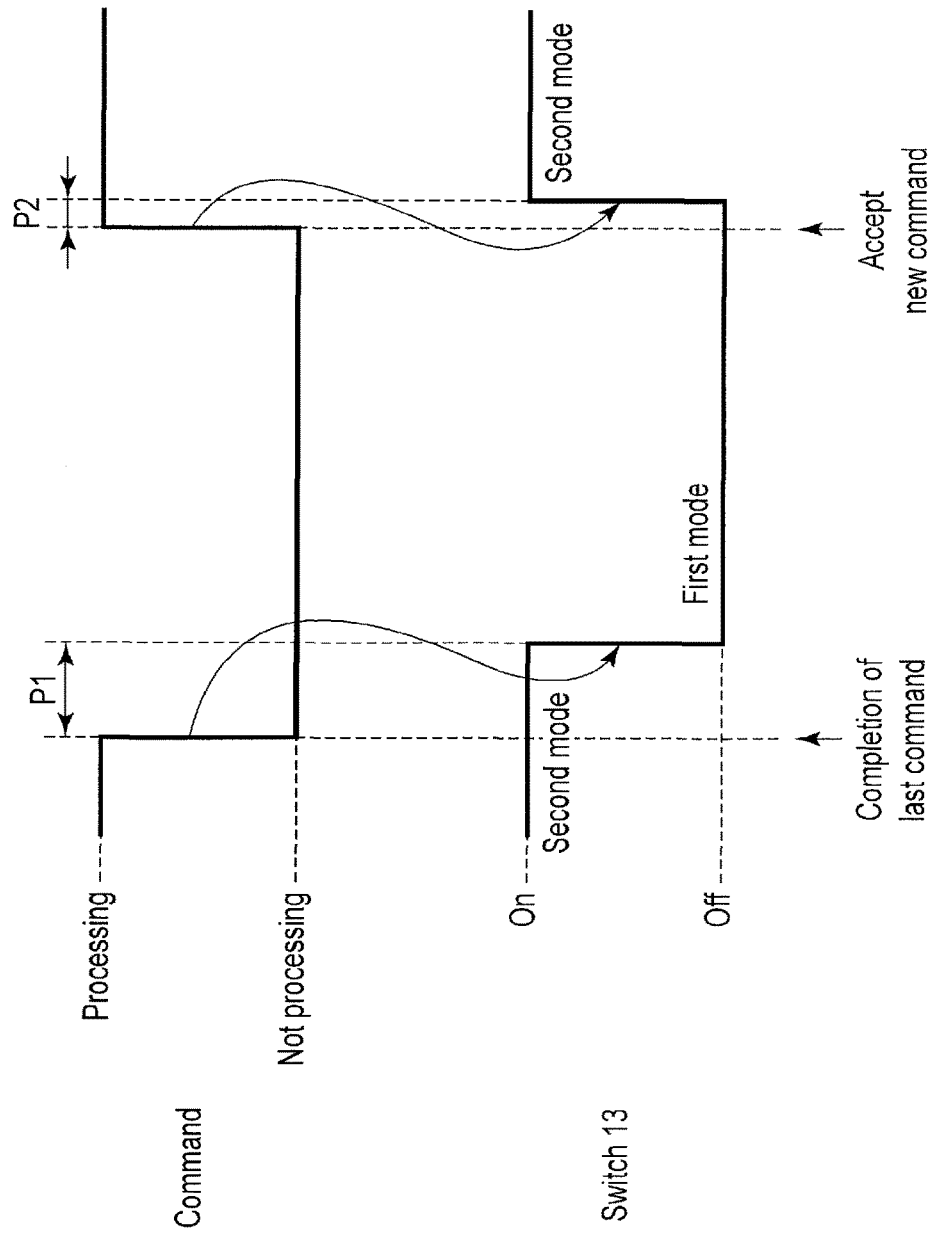
FIG. 5 is a diagram showing an example of switching between first and second modes.

If the first mode is a low power consumption mode and the second mode is a normal operation mode, for example, the first mode (i.e., an operation of turning off the switch element 13) is executed when the controller 11 does not accept a new command for a certain period P1 after completion of the last command in the second mode as shown in FIG. 5.

That is, as shown in FIG. 6, the controller 11 turns off the switch element 13 and switches the second mode to the first mode when the controller 11 does not accept a new command within the certain period P1 after the completion of the last command (steps ST11 and ST12).

For example, as shown in FIG. 5, the second mode (i.e., an operation of turning on the switch element 13) is executed when the controller 11 accepts a new command in the first mode.

That is, as shown in FIG. 7, the controller 11 immediately turns on the switch element 13 and switches the first mode to the second mode when the controller 11 accepts a new command from a host (steps ST21 and ST22).

A period P2 from receiving a new command by the controller 11 to turning on the switch element 13 by the controller 11 is extremely short.

A new command serving as a condition for switching between the first and second modes may be a predetermined specific type of command of various types of commands from the host, or any command.

In the former case, processing for specifying the type of command is necessary, but the power consumption of the nonvolatile memory 12 can be effectively reduced. For example, if the predetermined specific type of command is any command causing an operation in the nonvolatile memory 12, i.e., a command which accesses the nonvolatile memory 12, the power consumption of the nonvolatile memory 12 can be effectively reduced since a command not causing an operation in the nonvolatile memory 12 is not a condition for switching between the first and second modes.

In the latter case, since processing for specifying the type of command is unnecessary, the switching between the first and second modes can be executed speedily and the power consumption of the nonvolatile memory 12 can be effectively reduced.

As conditions for switching the first and second modes, the following may also be added.

In the storage device of the present embodiment, firmware is often read from the nonvolatile memory 12 to the controller 11 as initial setup when the system is driven on. On the assumption of this case, the second mode is preferably set for a certain period after the system is driven on.

In the storage device of the present embodiment, the controller 11 often accesses the nonvolatile memory 12 regardless of a command from the host. On the assumption of this case, the second mode is preferably set when the controller 11 independently accesses the nonvolatile memory 12.

The controller 11 independently accesses the nonvolatile memory 12, for example, when the controller 11 executes a self-checking operation for the nonvolatile memory 12, when the controller 11 stores an error history in the storage device as an error log in the nonvolatile memory 12, etc.

Second Embodiment

Figure 2:
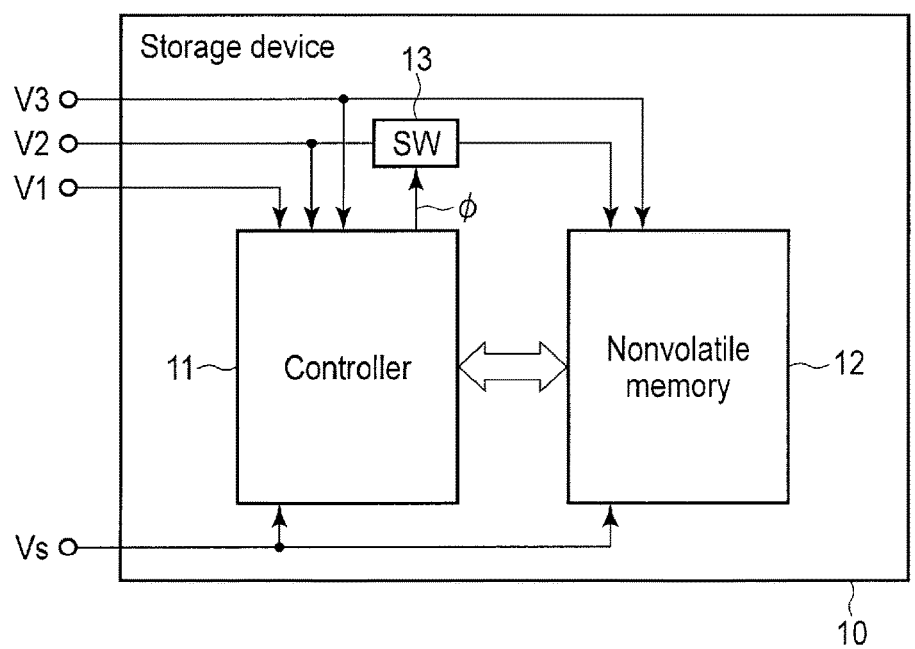
FIG. 2 is a diagram showing a storage device of a second embodiment.

FIG. 2 shows a storage device of a second embodiment.

A storage device 10 comprises a controller 11 and a nonvolatile memory 12. The controller 11 is driven by a plurality of power supply voltages, for example, first, second and third power supply voltages V1, V2 and V3. The nonvolatile memory 12 is controlled by the controller 11 and driven by a plurality of power supply voltages, for example, second and third power supply voltages V2 and V3. The nonvolatile memory 12 is, for example, a NAND flash memory. A reference voltage Vs is, for example, ground voltage, and is applied to the controller 11 and the nonvolatile memory 12.

The storage device 10 further comprises a switch element 13 which determines whether the second power supply voltage V2 is supplied to the nonvolatile memory 12. The switch element 13 is controlled to be turned on and off by a control signal $\phi$ from the controller 11. For example, the controller 11 turns off the switch element 13 in a first mode and turns on the switch element 13 in a second mode.

The second power supply voltage V2 is also applied to the controller 11, but may be applied only to the nonvolatile memory 12 instead of the controller 11. In the present embodiment, a switch element which determines whether the third power supply voltage V3 is supplied to the nonvolatile memory 12 may be further provided.

According to such a storage device, when data is not being transferred between the controller 11 and the nonvolatile memory 12, the controller 11 can reduce the power consumption of the nonvolatile memory 12 by switching the second mode to the first mode.

Figure 3:
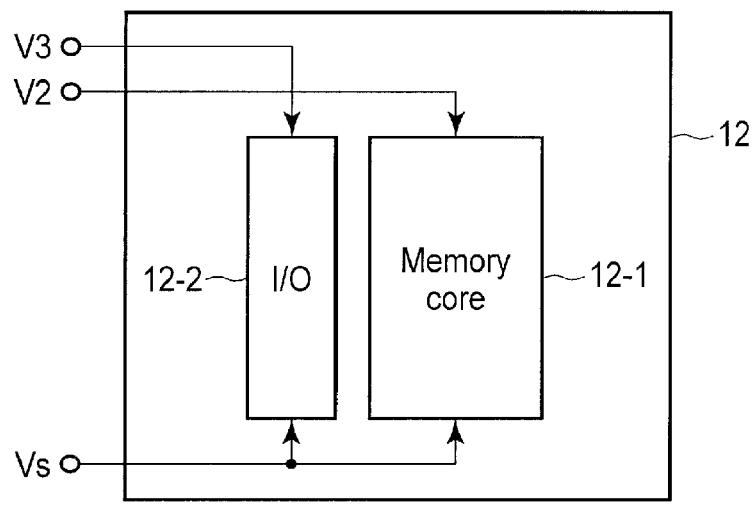
FIG. 3 is a diagram showing an example of a nonvolatile memory in the storage device of FIG. 2.

For example, as shown in FIG. 3, when the nonvolatile memory comprises a memory core 12-1 and an I/O part 12-2, the memory core 12-1 is driven by the second power supply voltage V2 and the I/O part 12-2 is driven by the third power supply voltage V3 different from the second power supply voltage V2. In general, the second power supply voltage V2 which drives the memory core 12-1 is larger than the third power supply voltage V3 which drives the I/O part 12-2.

When data is not being transferred between the controller 11 and the nonvolatile memory 12, the power consumption of the nonvolatile memory 12 can be reduced by interrupting the second power supply voltage V2 which drives the memory core 12-1 and making the power consumption of the memory core 12-1 zero.

When data is not being transferred between the controller 11 and the nonvolatile memory 12, the power consumption in the nonvolatile memory 12 can also be zero by interrupting the second and third power supply voltages V2 and V3.

The condition for switching between the first and second modes can be set in a similar way to the first embodiment. For example, the first mode is executed when the controller 11 does not accept a new command for a certain period after completion of the last command in the second mode. The second mode is executed when the controller 11 accepts a new command in the first mode.

Third Embodiment

The third embodiment is a modified embodiment of the first and second embodiments.

The third embodiment is characterized in that the switch element is provided in the controller in the first and second embodiments. In this case, the switch element is controlled by a control part in the controller, for example, a CPU core.

A case where the third embodiment is applied to the first embodiment is hereinafter described.

Figure 4:
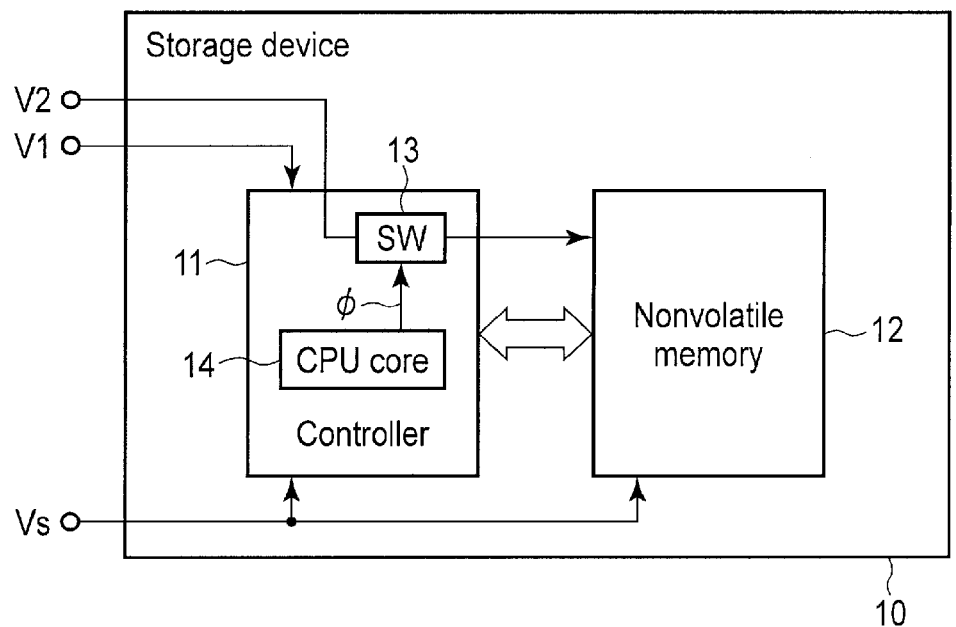
FIG. 4 is a diagram showing a storage device of a third embodiment.

FIG. 4 shows a storage device of the third embodiment.

A storage device 10 comprises a controller 11 and a nonvolatile memory 12. The controller 11 comprises a switch element 13 and a CPU core 14 and is driven by a first power supply voltage V1. The nonvolatile memory 12 is controlled by the controller 11 and driven by a second power supply voltage V2. A reference voltage Vs is, for example, ground voltage, and is applied to the controller 11 and the nonvolatile memory 12.

The switch element 13 determines whether the second power supply voltage V2 is supplied to the nonvolatile memory 12. The switch element 13 is controlled to be turned on and off by a control signal $\phi$ from the CPU core 14. For example, the CPU core 14 turns off the switch element 13 in a first mode and turns on the switch element 13 in a second mode.

According to such a storage device, when data is not being transferred between the controller 11 and the nonvolatile memory 12, the CPU core 14 can reduce the power consumption of the nonvolatile memory 12 by turning off the switch element 13.

Fourth Embodiment

FIG. 8 shows a memory system of a fourth embodiment.

The system comprises a storage device (for example, an SSD) 10 and a host 20. The storage device 10 comprises a controller 11 and a nonvolatile memory (for example, a NAND flash memory) 12. The controller 11 comprises a CPU core 14, a control logic 15, a command decoder 16, a queuing part (command list) 17 and a data buffer (buffer memory) 18.

A plurality of commands transferred from the host 20 are registered in the queuing part 17 in the controller 11 via the command decoder 16. Data related to the plurality of commands is temporarily stored in the data buffer 18. The data buffer 18 is, for example, a static random access memory (SRAM). The plurality of commands registered in the queuing part 17 are sequentially processed based on tag numbers.

The command logic 15 is, for example, a logic circuit to execute processing instructed by the CPU core 14.

The CPU core 14 executes the first mode where the second power supply voltage V2 is interrupted by the switch element 13 if a new command is not accepted in the queuing part 17 for a certain period after processing of the plurality of commands is completed and the queuing part 17 becomes empty.

The data buffer 18 is arranged in the controller 11 in the present embodiment, but is not limited to this arrangement. For example, the data buffer 18 may be arranged outside the controller 11. In this case, the data buffer 18 is, for example, a dynamic random access memory (DRAM), a magnetic random access memory (MRAM), etc.

The data buffer 18 may be a random access memory having a speed higher than the nonvolatile memory 12 serving as a storage memory.

Fifth Embodiment

The first to fourth embodiments are effective when they are applied to a product using a NAND flash memory as a nonvolatile memory, for example, an SSD and a memory card. With respect to the SSD, recently a BGA-SSD achieving increase in capacity and size reduction has been developed to be compatible with high-performance, compact portable equipment. Therefore, an example of the BGA-SSD is hereinafter described.

FIG. 9 and FIG. 10 show a structural example of the BGA-SSD. FIG. 10 is a cross-sectional view seen along line X-X in FIG. 9.

The BGA-SSD serving as a storage device 10 comprises an interconnect substrate 30, a controller (chip) 11 and a nonvolatile memory (chip) 12 mounted on a top surface of the interconnect substrate 30, a resin layer 31 which covers the controller 11 and the nonvolatile memory 12, and a plurality of electrodes (solder balls) 32 mounted on the undersurface of the interconnect substrate 30.

The interconnect substrate 30 has, for example, a multi-layer structure where a plurality of interconnect layers are deposited. The controller 11 and the nonvolatile memory 12 are connected to each other via bonding wires 33 and connected to one of the plurality of electrodes 32. The plurality of electrodes 32 include electrodes to which the power supply voltages of the first to fourth embodiments are applied.

In the present embodiment, the BGA-SSD serving as a storage device 10 comprises a plurality of nonvolatile memories 12. In this case, both increase in capacity and downsizing of the storage device 10 can be achieved by depositing the plurality of nonvolatile memories 12.

FIG. 11 shows an example of a memory cell array of a NAND flash memory.

The NAND flash memory comprises, for example, a plurality of physical blocks. A physical block is a unit of data erasure. Data elements of a plurality of memory cells in a physical block are erased together.

FIG. 11 shows an example of a memory cell array in a physical block.

A physical block BLOCK 1 comprises a plurality of memory cell units MU arrayed in a word line direction. A memory cell unit MU is arranged in a bit line direction intersecting the word line direction, and comprises a NAND string (memory cell string) comprising eight memory cells MC0 to MC7 of which current pathways are connected in series, a select transistor S1 on the side of a source line SL connected to an end of the current pathway of the NAND string, and a select transistor S2 on the side of a bit line BLj (j is an integer between 0 and m−1) connected to the other end of the current pathway of the NAND string.

A memory cell MCk (k is an integer between 0 and 7) comprises, a charge storage layer (for example, a floating gate electrode) FG and a control gate electrode CG.

A memory cell unit MU comprises eight memory cells MC0 to MC7 in the present embodiment, but the number of memory cells is not limited to this. For example, a memory cell unit MU may comprise two or more memory cells, for example, 32 or 56 memory cells.

The source line SL is connected to the end of the current pathway of the NAND string via the select transistor S1. The bit line BLj is connected to the other end of the current pathway of the NAND string via the select transistor S2.

Word lines WL0 to WL7 are commonly connected to control gate electrodes CG of the plurality of memory cells MC0 to MC7 in the word line direction. Similarly, a select gate line SGS is commonly connected to gate electrodes of a plurality of select transistors S1 in the word line direction. A select gate line SGD is commonly connected to electrodes of a plurality of select transistors S2 in the word line direction.

A page data element is stored in m memory cells connected to a word line WLi (i is an integer between 0 and 7). For example, a page data element PAGE 7 is stored in m memory cells connected to the word line WL7. A page data element is m-bit data (for example, m is 512, 1024, 2048, etc.).

Data is read and written per page data element.

Each of the plurality of memory cells MC0 to MC7 may be a binary type which stores one-bit data, and may be a multivalued type which stores two or more bits of data. In the latter case, two or more page data elements are stored in m memory cells connected to a word line WLi.

CONCLUSION

As described above, according to the embodiments, the power consumption of a storage device provided in portable equipment can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A data storage device comprising:
a controller driven by a first power supply voltage;
a nonvolatile memory controlled by the controller and driven by a second power supply voltage;
a switch element determining whether or not the second power supply voltage is applied to the nonvolatile memory, a first power consumption being generated by the second power supply voltage in the nonvolatile memory when turning on the switch element, and a second power consumption lower than the first power consumption being generated in the nonvolatile memory when turning off the switch element, wherein the controller is configured to turn off the switch element in a first mode and turn on the switch element in a second mode, wherein the first mode is executed when the controller receives no new command for a first period after a last command is executed in the second mode, wherein the new command is a command which accesses the nonvolatile memory, wherein the nonvolatile memory comprises a memory core and an I/O part, wherein the memory core is driven by the second power supply voltage, and wherein the I/O part is driven by a third power supply voltage different from the second power supply voltage.

2. The device of claim 1, wherein
the second mode is executed when the controller receives a new command in the first mode.

3. The device of claim 2, wherein
the new command is a command which accesses the nonvolatile memory.

4. The device of claim 1, wherein
the second power supply voltage is larger than the third power supply voltage.

5. The device of claim 1, wherein
the switch element is provided outside the controller.

6. The device of claim 1, wherein
the switch element is provided inside the controller.

7. The device of claim 1, wherein
the controller comprises a queuing part which stores commands, and
the first mode is executed when no new command is stored in the queuing part within a second period after the queuing part stores no command.

8. A data storage device comprising:
a controller driven by a first power supply voltage;
a nonvolatile memory controlled by the controller and driven by the first power supply voltage; and
a switch element determining whether or not the first power supply voltage is applied to the nonvolatile memory, a first power consumption being generated by the first power supply voltage in the nonvolatile memory when turning on the switch element, and a second power consumption lower than the first power consumption being generated in the nonvolatile memory when turning off the switch element, wherein the controller is configured to turn off the switch element in a first mode and turn on the switch element in a second mode, the first mode is executed when the controller receives no new command for a first period after a last command is executed in the second mode, the new command is a command which accesses the nonvolatile memory, the nonvolatile memory comprises a memory core and an I/O part, the memory core is driven by the first power supply voltage, and the I/O part is driven by a second power supply voltage different from the first power supply voltage.

9. The device of claim 8, wherein
the second mode is executed when the controller receives a new command in the first mode.

10. The device of claim 9, wherein
the new command is a command which accesses the nonvolatile memory.

11. The device of claim 8, wherein
the first power supply voltage is larger than the second power supply voltage.

12. The device of claim 8, wherein
the switch element is provided outside the controller.

13. The device of claim 8, wherein
the switch element is provided inside the controller.

14. The device of claim 8, wherein
the controller comprises a queuing part which stores commands, and
the first mode is executed when no new command is stored in the queuing part within a second period after the queuing part stores no command.

* * * * *